（12）United States Patent
Banghart et al.

(10) Patent No.: US 9,679,990 B2
(45) Date of Patent: Jun. 13, 2017

(54) SEMICONDUCTOR STRUCTURE(S) WITH EXTENDED SOURCE/DRAIN CHANNEL INTERFACES AND METHODS OF FABRICATION

(71) Applicant: GLOBALFOUNDRIES Inc., Grand Cayman (KY)

(72) Inventors: Edmund Kenneth Banghart, Pittsford, NY (US); Mitsuhiro Togo, Ballston Lake, NY (US); Shesh Mani Pandey, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/454,778

(22) Filed: Aug. 8, 2014

(65) Prior Publication Data

US 2016/0043190 A1 Feb. 11, 2016

(51) Int. Cl.
*H01L 29/66* (2006.01)
*H01L 29/78* (2006.01)

(52) U.S. Cl.
CPC ...... *H01L 29/66795* (2013.01); *H01L 29/785* (2013.01)

(58) Field of Classification Search
CPC . H01L 27/092; H01L 27/78; H01L 27/11502; H01L 28/55; H01L 21/823821; H01L 29/66; H01L 29/78; H01L 29/8238; H01L 29/66795; H01L 29/785; H01L 29/7856; H01L 21/768; H01L 21/76877; H01L 21/76898; H01L 29/417; H01L 29/41791

USPC ....... 438/510, 230, 362, 369, 372, 373, 302, 438/305, 306, 307
See application file for complete search history.

(56) References Cited

U.S. PATENT DOCUMENTS

| | | | |
|---|---|---|---|
| 2009/0142897 A1* | 6/2009 | Chau et al. ................... 438/285 |
| 2011/0068407 A1* | 3/2011 | Yeh et al. ...................... 257/369 |
| 2012/0032275 A1* | 2/2012 | Haran et al. .................. 257/401 |
| 2012/0032278 A1* | 2/2012 | Kammler .......... H01L 21/26506 257/408 |
| 2012/0256240 A1* | 10/2012 | Griebenow ....... H01L 21/26586 257/288 |
| 2015/0035062 A1 | 2/2015 | Liu et al. |

(Continued)

*Primary Examiner* — Chuong A Luu
(74) *Attorney, Agent, or Firm* — Heslin Rothenberg Farley & Mesiti P.C.; Teige P. Sheehan (57) ABSTRACT

Semiconductor structures and methods of fabrication are provided, with one or both of an extended source-to-channel interface or an extended drain-to-channel interface. The fabrication method includes, for instance, recessing a semiconductor material to form a cavity adjacent to a channel region of a semiconductor structure being fabricated, the recessing forming a first cavity surface and a second cavity surface within the cavity; and implanting one or more dopants into the semiconductor material through the first cavity surface to define an implanted region within the semiconductor material, and form an extended channel interface, the extended channel interface including, in part, an interface of the implanted region within the semiconductor material to the channel region of the semiconductor structure. In one embodiment, the semiconductor structure with the extended channel interface is a FinFET.

13 Claims, 3 Drawing Sheets

(56) References Cited

U.S. PATENT DOCUMENTS

2015/0060945 A1\* 3/2015 Murthy ............ H01L 21/28512
257/192

\* cited by examiner

SEMICONDUCTOR STRUCTURE(S) WITH EXTENDED SOURCE/DRAIN CHANNEL INTERFACES AND METHODS OF FABRICATION

FIELD OF THE INVENTION

The present invention relates to semiconductor structures, and to methods of fabricating semiconductor structures, and in particular to semiconductor structures with extended source-to-channel interfaces and/or extended drain-to-channel interfaces, and to methods of fabrication thereof.

BACKGROUND OF THE INVENTION

Semiconductor structures, such as field-effect transistors (FETs), have conventionally been fabricated as planar circuit elements. More recently, fin-type field-effect transistor (FinFET) devices have been developed to replace planar transistors, such as metal oxide semiconductor field-effect transistors (MOSFETs), in advanced complementary metal oxide semiconductor (CMOS) technology, due to their improved short channel effect immunity and higher on-current to off-current ratio ($I_{on}/I_{off}$). As is known, the term "fin" refers to a vertical structure within or upon which are formed, for instance, one or more FinFETs or other fin devices, such as passive devices, including capacitors, diodes, etc.

As described by Moore's Law, the semiconductor industry continues to drive down pattern dimensions in order to reduce transistor size and enhance processor speed at a rapid pace. Further enhancements in transistor designs and fabrication methods therefor continue to be pursued, for enhanced performance and commercial advantage.

BRIEF SUMMARY

The shortcomings of the prior art are overcome, and additional advantages are provided, through the provision, in one aspect, of a method, which includes: recessing a semiconductor material to form a cavity therein adjacent to a channel region of a semiconductor structure being fabricated, the recessing forming a first cavity surface and a second cavity surface within the cavity; and implanting one or more dopants into the semiconductor material through the first cavity surface to define an implanted region within the semiconductor material, and form an extended channel interface, the extended channel interface including, in part, an interface of the implanted region within the semiconductor material to the channel region of the semiconductor structure.

In a further aspect, a device is provided which includes a semiconductor structure. The semiconductor structure includes a source region and a drain region separated by a channel region, the channel region residing within a semiconductor material and the source region and the drain region respectively including an implanted source region within a semiconductor material and an implanted drain region within the semiconductor material. Further, the implanted source region provides the semiconductor structure with an extended source channel interface and the implanted drain region provides the semiconductor structure with an extended drain channel interface.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure. Also note that reference is made below to the drawings, which are not drawn to scale for ease of understanding, wherein the same reference numbers used throughout different figures designate the same or similar components.

Disclosed herein, in part, is a method of fabricating a semiconductor structure with an extended source-to-channel interface and an extended drain-to-channel interface within a semiconductor material, which advantageously improves circuit performance by extending the positioning of the source and drain regions into the semiconductor material adjacent to the channel region of the semiconductor structure. During fabrication of semiconductor devices such as, for instance, fin-type field-effect transistor (FinFET) devices, a gate structure is typically wrapped around the channel region of one or more fin structures or fin(s). In operation of such FinFET devices, when an appropriate voltage is applied on the gate structure, charge carriers (for instance, electrons (generated by n-type dopants) or holes (generated by p-type dopants)) will flow from a source region to a drain region through a channel region of the device below the gate. However, with continual decreased scaling of transistors, a challenge exists for reducing device-on resistance, without increasing short channel effect (SCE) or punch-through current leakage. Increasing effective depth of the channel region by exposing a greater surface area of the fin(s) and wrapping the gate structures around the exposed portion of the fin(s), for instance, facilitates increasing current charge inversion within the fin(s) which, in one example, may be one solution to the problem. Note that such an increase in the effective depth of the channel region disadvantageously creates a mis-match though between the positioning of the source and drain regions and the exposed channel region underlying the gate structure, potentially resulting in increasing device-on resistance of the resultant FinFET device(s).

Figure 1A:
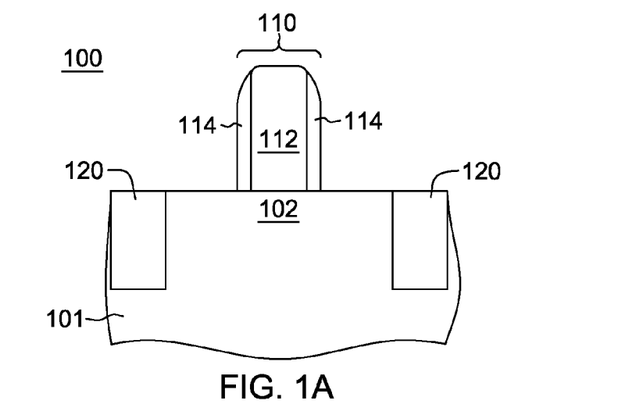
FIGS. 1A-1C depict one embodiment of a process for fabricating a semiconductor structure with a source channel interface and a drain channel interface which may be modified, in accordance with one or more aspects of the present invention.
Figure 1B:
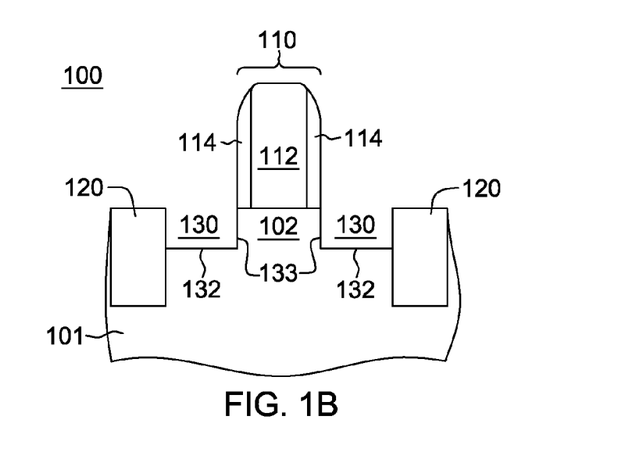
Figure 1C:
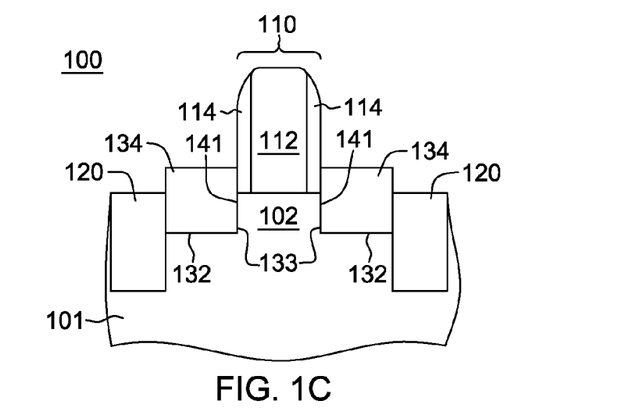

By way of example, FIGS. 1A-1C illustrate one embodiment of a process for fabricating a semiconductor device, such as a fin-type field-effect transistor (FET), which includes, for instance, a source-to-channel interface and a drain-to-channel interface. Referring to FIG. 1A, a cross-sectional elevational view is shown of a structure 100 obtained during one embodiment of a method for fabricating a semiconductor structure, such as planar field-effect transistor, or fin-type field-effect transistor. In the illustrated example, a substrate 101, which may be a semiconductor substrate, is provided, along with a gate structure 110 overlying a channel region 102 within substrate 101. By way of example, gate structure 110 may be a sacrificial gate structure for use in a gate-last process, in which gate structures are provided after establishment of the source region and the drain region of the semiconductor structure. In one embodiment, gate structure 110 includes, by way of example only, a sacrificial gate material 112 (such as polysilicon), and sidewall spacers 114 (formed, for example, from an oxide material). If desired, a gate cap (not shown) may be provided over sacrificial gate material 112. Note that in another embodiment, gate structure 110 could be a gate structure of a typical gate-first process, in which gate structures are provided before establishment of the source and drain regions of the transistor. In such a case, the sacrificial gate material would be replaced by one or more gate metals disposed above a gate dielectric, both of which may be surrounded or protected by sidewall spacers 114. An isolation region 120, such as shallow trench isolation, may at least partially surround the semiconductor structure.

By way of example, substrate 101 may be a bulk semiconductor material, such as a bulk silicon wafer. In another example, the substrate may be or include any silicon-containing substrate material including, but not limited to, single-crystal Si, polycrystalline Si, amorphous Si, Si-on-nothing (SON), Si-on-insulator (SOI), or Si-on-replacement insulator (SRI) substrates, and the like, and may be N-type or P-type doped, as desired for a particular application. In a further example, the substrate may be, for instance, a wafer or substrate approximately 600-700 micrometers thick, or less. The substrate may include other suitable elementary semiconductors, such as, for example, germanium (Ge), a crystal, or a compound semiconductor such as silicon carbide (SiC), gallium arsenide (GaAs), gallium phosphide (GaP), indium phosphide (InP), indium arsenide (InAs), and/or indium antimonide (InSb), or combinations thereof; or an alloy semiconductor including: GaAsP, AlInAs, GaInAs, GaInP, or GaInAsP, or combinations thereof. In another example, substrate 101 may include multiple layers of material.

In another embodiment, substrate 101 may include one or more three-dimensional fin structures, which extend from the substrate. In such a case, the gate structures may wrap up, over, and down the fin structure, so that a control voltage may be applied at two or more surfaces of the fin structure, and in particular, to two or more surfaces of a channel region of the fin structure, allowing for a greater current to flow through the structure between a source region and a drain region during operation.

As illustrated in FIG. 1B, substrate 101 is recessed adjacent to channel region 102 to form one or more cavities 130 therein, including, for instance, a source cavity and a drain cavity, separated by channel region 102. A variety of processing techniques may be employed to pattern substrate 101, and remove material thereof to form cavities 130, each with a first cavity surface 132 and a second cavity surface 133. For example, substrate 101 may be patterned using direct lithography, sidewall image transfer techniques, extreme ultra-violet lithography (EUV), e-beam techniques, litho-etch techniques, or litho-etch-litho-freeze techniques. Removal of material may be accomplished using any suitable removal process, such as an etching process with an etchant selected to etch, for instance, the material of the substrate. In one specific example, reactive ion etching may be performed using fluorine-based chemistry, and gases such as tetrafluoromethane ($CF_4$), trifluoromethane ($CHF_3$), difluoromethane ($CH_2F_2$), fluoromethane ($CH_3F$), octofluoromethane ($C_4F_8$), hexafluoro-1,3-butadiene ($C_4F_6$), sulfur hexafluoride ($SF_6$), oxygen ($O_2$), and the like. In one implementation, cavities 130 may be box shaped with nearly perpendicular side walls. In another implementation, cavities 130 may have other shapes, and may have angular sidewalls. In one specific implementation, cavities 130 may be sigma cavities, which are named for the resemblance between the Greek-letter Σ (sigma) and the profile of its angular sidewall planes, which may include {111}, {110}, and/or {100} planes.

FIG. 1C illustrates the structure of FIG. 1B after forming source and drain regions 134, at least partially, within source and drain cavities 130 (FIG. 1B). In one embodiment, source and drain regions 134 may be formed by, for instance, epitaxially growing a source and drain material from the exposed semiconductor material of substrate 101 within source and drain cavities 130 (FIG. 1B). Epitaxial growing refers to the orderly growth of a crystalline material, where the grown material arranges itself in the same crystal orientation as the underlying structure. In one example, the source and drain material may be epitaxially grown using selective epitaxial growth via various methods such as, for example, CVD, low-pressure CVD (LPCVD), or other applicable methods. By way of example, in the case of a p-type, field-effect transistor, the epitaxially grown source and drain regions 134 may be doped silicon germanium-based epitaxy, and in the case of an n-type, field-effect transistor, the source and drain regions 134 may be silicon-based epitaxy.

One challenge with the above-described approach for forming source and drain regions adjacent to the channel region of the semiconductor structure is that the depth of the source-to-channel interface and depth of the drain-to-channel interface is limited, for instance, by the depth of the recessed source and drain cavities. For instance, as noted above, in the case of fin-type field-effect-transistor, the effective depth of the channel region may be increased by exposing a greater surface area of the fin(s) and subsequently wrapping the gate structure around the exposed portion of the fin(s). In such a case, the advantages of a greater gate-to-channel surface area are not captured as the depth of the recessed source and drain cavities cannot be easily extended to match the depth of the source-to-channel interface and the drain-to-channel interface. The newly exposed portion of the channel region, which would normally result in increasing the device on-current of the resultant FinFET device(s), is therefore underutilized and, in particular, will contribute to undesirable parasitic resistances and capacitances of the resultant FinFET device(s).

Figure 2A:
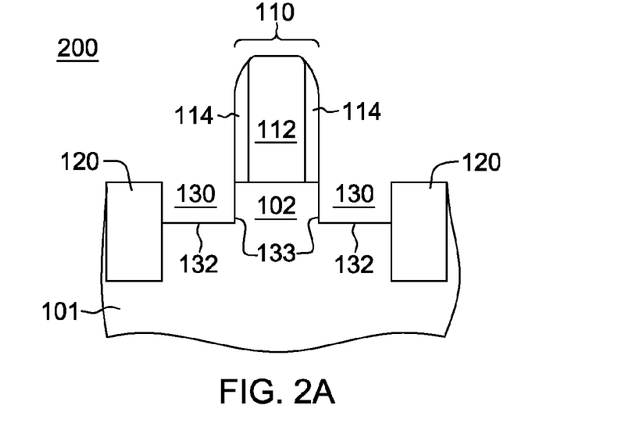
FIG. 2A is a partial cross-sectional elevational view of one embodiment of a semiconductor structure obtained during device fabrication, in accordance with one or more aspects of the present invention.
Figure 2B:
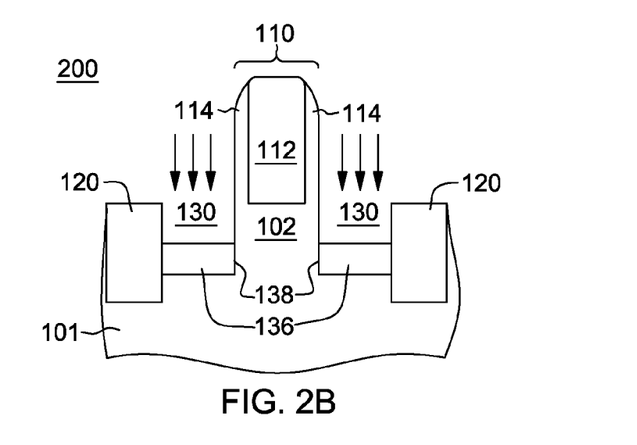
FIG. 2B depicts the structure of FIG. 2A, after implanting one or more dopants through a horizontal cavity surface of the source and drain cavities to define implanted source and drain regions, respectively, in accordance with one or more aspects of the present invention.
Figure 2C:
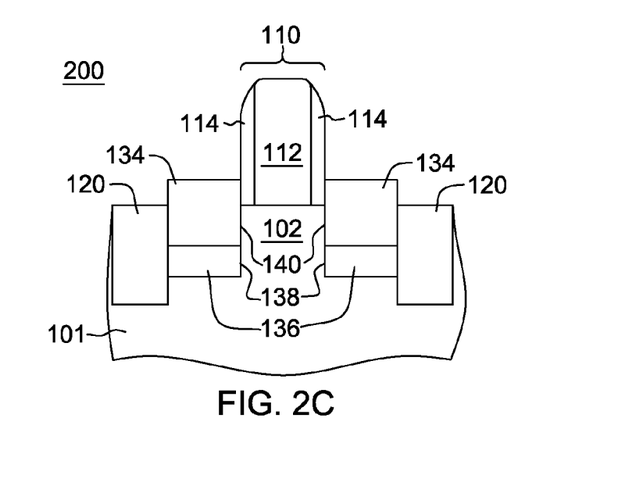
FIG. 2C depicts the structure of FIG. 2B, after provision of epitaxial source and drain regions at least partially within the source and drain cavities, respectively, completing one embodiment of the extended source and drain channel interfaces, in accordance with one or more aspects of the present invention.

FIGS. 2A-2C depict one embodiment of a transistor fabrication process which extends the source-to-channel interface and the drain-to-channel interface relative to the channel region of the semiconductor device(s) without the above-noted limitations.

Before discussing the exemplary process of FIGS. 2A-2C, however, generally stated, provided herein are methods for fabricating semiconductor structures with extended source-to-channel interfaces and extended drain-to-channel interfaces. The method includes, for instance, recessing a semiconductor material to form a cavity therein adjacent to a channel region of a semiconductor structure being fabricated, the recessing forming a first cavity surface and a second cavity surface within the cavity; and implanting one or more dopants into the semiconductor material through the first cavity surface to define an implanted region within the semiconductor material, and form an extended channel interface, the extended channel interface including, in part, an interface of the implanted region within the semiconductor material to the channel region of the semiconductor structure.

By way of example, implanting the one or more dopants into the semiconductor material through the first cavity surface positions, at least in part, the interface of the implanted region parallel to the second cavity surface of the cavity. In one example, the one or more dopants being implanted into the semiconductor material may be or include an n-type dopant such as, for example, phosphorus, antimony or arsenic. In another example, the one or more dopants being implanted into the semiconductor material may be or include a p-type dopants such as, for example, boron, aluminum, gallium or indium. In one implementation, implanting the one or more dopants may also include implanting the one or more dopants through the first cavity surface at an implant angle which results in extending the interface of the implanted region within the semiconductor material at an angle from the second cavity surface of the cavity. Note that in another implementation, the extended channel interface further includes, in part, the second cavity surface of the cavity.

In one implementation, the interface of the implanted region to the channel region may be non-planar with the second cavity surface of the cavity. Further, the implanting may include implanting the one or more dopants through the first cavity surface while minimizing lateral diffusion of the one or more dopants within the semiconductor material, thereby controlling location of the interface of the implanted region within the semiconductor material to the channel region. In another example, the implanting may include implanting the one or more dopants into the semiconductor material through the first cavity surface at an implant angle which is normal to the first cavity surface, with the implant angle facilitating forming the interface of the implanted region to the channel region coplanar with the second cavity surface. The implanting may also include implanting the one or more dopants into the semiconductor material through the first cavity surface with an implant energy which attains a depth of the interface of the implanted region to the channel region at a desired depth within the semiconductor material.

In another implementation, the method may include forming a source region or a drain region within, at least partially, the cavity subsequent to the implanting of the one or more dopants through the first cavity surface. By way of example, this forming may include epitaxially growing the source region or the drain region at least partially within the cavity, where the implanting and the epitaxially growing together define the extended channel interface to the channel region of the semiconductor structure. Advantageously, the implanted region within the semiconductor material facilitates increasing junction on-current while minimizing junction leakage current of the resultant semiconductor structure. For instance, by placing the peak of the implanted region sufficiently below the first cavity interface, the crystalline order of the substrate is minimally disrupted such that high-quality, low-defect epitaxial growth of the source and drain regions is maintained.

In yet another implementation, the cavity is a source cavity, the implanted region is an implanted source region, the extended channel interface is an extended source channel interface, and the recessing further includes recessing the semiconductor material to also form a drain cavity adjacent to the channel region. The implanting further includes implanting through a first drain cavity surface the one or more dopants to form a drain implanted region, and the method further includes epitaxially growing a source region over the implanted source region and a drain region over the implanted drain region, the implanting and the epitaxially growing together define the extended source channel interface and an extended drain channel interface. The implanting may further include performing an annealing process, subsequent to the implanting of the one or more dopants into the semiconductor material, the annealing process facilitating stabilizing the implanted region within the semiconductor material. Additionally, in one embodiment, the method may further include fabricating a fin-type field-effect transistor (FinFET), the FinFET being the semiconductor structure, with the fabricating including the recessing of the one or more cavities and the implanting of the one or more dopants within the cavities, for instance, to extend the channel region of the FinFET.

In another aspect, a device is disclosed which includes a semiconductor structure, with a source region and a drain region separated by a channel region. The channel region resides within a semiconductor material, and the source region and the drain region includes an implanted source region within the semiconductor material and an implanted drain region within the semiconductor material. The implanted source region provides the semiconductor structure with an extended source channel interface and the implanted drain region provides the semiconductor structure with an extended drain channel interface.

Referring to FIG. 2A, a structure 200 is illustrated similar or identical to structure 100 of FIG. 1B of the above-described processing flow. Briefly, structure 200 includes substrate 101, along with gate structure 110 overlying channel region 102 within substrate 101. In one example, gate structure 110 may include a sacrificial gate material 112 and sidewall spacers 114, as described above. As noted, substrate 101 may be or include a semiconductor material, such as described above in connection with FIGS. 1A-1C. Substrate 101 is recessed adjacent to channel region 102 to form one or more cavities 130 therein, including, for instance, a source cavity and a drain cavity, separated by channel region 102, as illustrated. Isolation regions 120, such as a shallow trench isolation, at least partially surrounds the transistor, which as noted, may be (for instance) a planar field-effect transistor or a fin-type, field-effect transistor. At the processing stage of FIG. 2A, first horizontal cavity surfaces 132 and second vertical cavity surfaces 133 of cavities 130 are exposed. Note that cavities 130 may have been patterned and etched as described above in connection with FIGS. 1A-1C.

FIG. 2B depicts the structure of FIG. 2A, after implanting one or more dopants through horizontal cavity surfaces 132 (FIG. 2A) of source and drain cavities 130 to define implanted source and drain regions 136 respectively within substrate 101, in accordance with one or more aspects of the present invention. Note that, in one embodiment, the implanted source and drain regions 136 within substrate 101 are designed to extend the interface of the source and drain regions relative to channel region 102 of the structure 200, defining (in part) an extended source and drain channel interface 138 to channel region 102 of the semiconductor structure. By way of example, the dopant(s) may be implanted into substrate 101 via, for instance, an ion implantation process employing controlled process parameters such as, for example, implantation energy, implantation dose and/or implantation angle, so as to facilitate minimizing or preventing lateral diffusion of the dopant(s), for instance, into the adjacent channel region 102 disposed within substrate 101. Note that this minimizing of the lateral diffusion of the dopant(s), which may also be referred to as lateral straggle of the dopant(s) advantageously facilitates controlling location of the interface of the implanted source and drain regions 136 to the adjoining channel region 102. For instance, the dopant(s) may be implanted into substrate 101 through horizontal cavity surface 132 (FIG. 2A) of source and drain cavities 130 at an implant angle which is normal to horizontal cavity surface 132. Note that the implant angle being normal to horizontal cavity surface 132 advantageously facilitates forming the interface of implanted source and drain regions 136 to the channel region 102 substantially coplanar with respective vertical cavity surfaces 133 (FIG. 2A) of source and drain cavities 130, as depicted in FIG. 2B.

In another example, the dopants(s) may also be implanted into substrate 101 through horizontal cavity surfaces 132 (FIG. 2A) of source and drain cavities 130 with an implantation energy which facilitates controlling depth of the implanted source and drain regions 136 extending into substrate 101. Note that such controlling of implantation energy advantageously facilitates controlling depth of the interface of implanted source and drain regions 136 to channel region 102. In one example, the depth of the respective implanted source and drain regions 136 extending into substrate 101 may be within a range of about 5 to 30 nm.

By way of example, the one or more dopants implanted through the horizontal cavity surface 132 may be a p-type dopant or an n-type dopant. As used herein, p-type dopant refers to the addition of an impurity to substrate 101 (including, for instance, an intrinsic semiconductor material) to create deficiencies of valence electrons. Examples of a p-type dopant may include boron, aluminum, gallium or indium, any one or more of which may be added to substrate 101, which may itself include, for instance, a silicon material. In a specific example, substrate 101 may be implanted through horizontal cavity surfaces 132 (FIG. 2A) of source and drain cavities 130 with a p-type dopant such as, for instance, boron or a compound of boron (for instance, boron trifluoride ($BF_3$), octadecaborane ($B_{18}H_{22}$)) by employing an implantation dose of about 1e14 to 2e15 atom/cm$^{2'}$ with an implantation energy of about 2 to 10 keV, to define implanted source and drain regions 134 respectively, within substrate 101. An n-type dopant refers to the addition of impurities to substrate 101 (including, for instance, an intrinsic semiconductor material) which contribute more electrons to the intrinsic material, and may include (for instance) phosphorus, antimony or arsenic. In a specific example, substrate 101 may be implanted through horizontal cavity surfaces 132 (FIG. 2A) of source and drain cavities 130 with an n-type dopant such as, for instance, phosphorus or a compound of phosphorus (for instance, heptaphosphane ($P_7H_3$)), by employing an implantation dose of about 1e14 to 2e15 atom/cm$^2$, with an implantation energy of about 5 to 25 keV, to define implanted source and drain regions 134 respectively within substrate 101.

Continuing with FIG. 2B, structure 200 may be subjected to an annealing process to facilitate stabilizing the dopant(s) within the implanted source and drain regions 136, to facilitate achieving a desired configuration and distribution of dopants within implanted source and drain regions 136. Note that, the crystal lattice structure of the silicon substrate material may be altered, for instance, during the ion implantation process, resulting in the dopants of the implanted source and drain regions 136 being weakly bound to the silicon substrate material. Upon performing a high temperature annealing process, the crystal lattice structure of the implanted source and drain regions may be adjusted to better position the dopant into the crystal lattice structure of the implanted source and drain regions, thereby stabilizing the dopants within the implanted source and drain regions. The high temperature annealing process may be performed using, for instance, a spike annealing, laser annealing, rapid thermal annealing (RTA), flash annealing or the like. In one example, the high temperature annealing process may be performed using an RTA annealing process at an elevated temperature of about 950° C. to 1050° C. in the presence of inert gas such as, Argon (Ar), having a pressure of about 1 atm pressure.

Additionally, in another embodiment, the dopant(s) may be implanted into substrate 101 through the horizontal cavity surfaces 132 (FIG. 2A) while controlling the process parameters such as, for instance, implantation angle and/or implantation dose employed to facilitate altering the positioning of the interfaces of implanted source and drain regions 136 within substrate 101 relative to the vertical cavity surfaces 133 (FIG. 2A). In one example, the implant angle and/or implantation dose employed during the ion implantation process may be controlled so as to facilitate providing a non-planar interface relative to the vertical cavity surfaces 133 of source and drain cavities. For instance, the implant angle employed during the ion implantation process may be within a range of about 5 to 30°, while the implantation dose (e.g., Phosphorus) may be within a range of about 1e14 to 2e15 atom/cm$^2$. In another example, the dopant(s) may be implanted into substrate 101 through horizontal cavity surfaces 132 (FIG. 2A) at an implant angle which results in extending the interface of the implanted source and drain regions 136 within substrate 101 at an angle relative to the vertical cavity surfaces 133 (FIG. 2A). In a specific example, the interface of the implanted source and drain regions 136 within substrate 101 may extend at an angle of about 5 to 30°, relative to the vertical cavity surfaces 133 (FIG. 2A).

FIG. 2C illustrates the structure of FIG. 2B after forming source and drain regions 134, at least partially, within source and drain cavities 130 (FIG. 1B), and more particularly, over the respective implanted source and drain regions 136 of substrate 101. In one embodiment, source and drain regions 134 may be formed by, for instance, epitaxially growing a source and drain material from, in part, the exposed implanted source and drain regions 136 of substrate 101 within source and drain cavities 130 (FIG. 1B). Epitaxial growing refers to an orderly growth of a crystalline material, where the grown material arranges itself in the same crystal orientation as the underlying structure. In one example, source and drain material may be epitaxially grown using selective epitaxial growth via various methods such as, for example, CVD, low-pressure CVD (LPCVD), or other applicable methods. By way of example, in the case of a p-type, field-effect transistor, the epitaxially grown source and drain regions 134 may be doped silicon germanium-based epitaxy, and in the case of an n-type, field-effect transistor, the source and drain regions 134 may be silicon-based epitaxy.

Figure 3A:
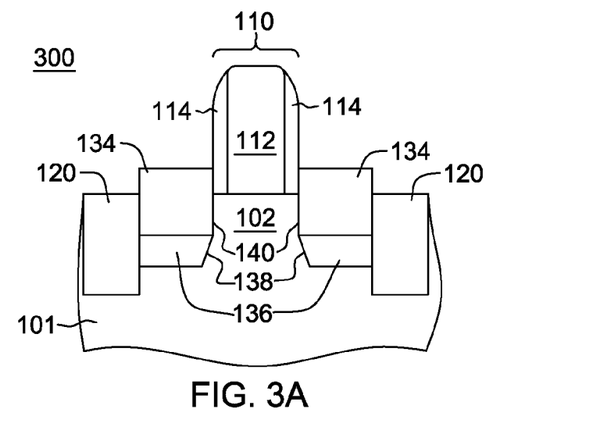
FIG. 3A depicts an alternate embodiment of the structure of FIG. 2C, with the implanted source and drain region interfaces to the channel region extending at an angle relative to a sidewall interface of the epitaxial source and drain regions to the channel region, in accordance with one or more aspects of the present invention.
Figure 3B:
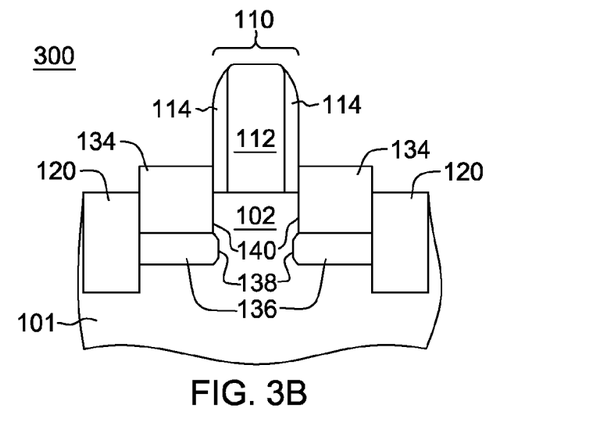
FIG. 3B depicts another alternate embodiment of the structure of FIG. 2C, with the implanted source and drain region interfaces to the channel regions being parallel with the sidewall interfaces of the epitaxial source and drain regions to the channel region, in accordance with one or more aspects of the present invention.
Figure 3C:
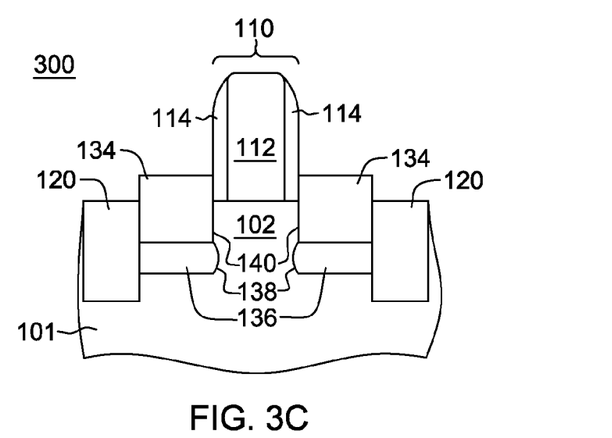
FIG. 3C depicts an alternate embodiment of the structure of FIG. 2C, with the implanted source and drain region interfaces to the channel regions being non-planar to the sidewall interfaces of the epitaxial source and drain regions to the channel region, in accordance with one or more aspects of the present invention.

Note that, in this embodiment, sidewall interface 140 of the epitaxially grown source and drain regions 134 and interface 138 of the implanted source and drain regions 136 together, provide structure 200 with an extended source-to-channel interface and an extended drain-to-channel interface, respectively. These extended source-to-channel and drain-to-channel interfaces are extended because the interface to the channel region 102 extends into substrate 101. In one example, the depth of the interface 138 of the implanted source and drain regions 136 relative to the depth of the sidewall interface 140 of the epitaxially grown source and drain regions 134 may be within a range of 5 to 100%. Note also that, as discussed above, the implanted source and drain regions 136 formed by, for instance, controlling of the process parameters via, for instance, ion implantation, allows the position of the extended source-to-channel interface and the extended drain-to-channel interface relative to the channel region to be controlled. For instance, in one embodiment, interface 138 of the implanted source and drain regions 136 to channel region 102 may be at an angle relative to the respective sidewall interfaces 140 of the epitaxially grown source and drain regions 134, as illustrated in FIG. 3A. Further, depending on the implant angle employed during the forming of the implanted source and drain regions 136, interface 138 of the implanted source and drain regions 136 to the channel may either be parallel (FIG. 3B) or non-planar (FIG. 3C) with sidewall interface 140 of the epitaxially grown source and drain regions 134 as illustrated.

Advantageously, one skilled in the art will note that the fabrication processing of FIGS. 2A-2C facilitates in extending the source-to-channel interface and the drain-to-channel interface into the semiconductor material of the semiconductor structure, thereby facilitating operation of the resultant device. For instance, the extended source-to-channel interface and the extended drain-to-channel interface would advantageously facilitate increasing junction on-current, while minimizing junction leakage current of the resultant semiconductor structure.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form of contain, such as "contains" and "containing") are open-ended linking verbs. As a result, a method or device that "comprises," "has," "includes," or "contains" one or more steps or elements possesses those one or more steps or elements, but is not limited to possessing only those one or more steps or elements. Likewise, a step of a method or an element of a device that "comprises," "has," "includes," or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
  recessing a semiconductor material to form a cavity therein adjacent to a channel region of a semiconductor structure being fabricated, the recessing forming a first cavity surface and a second cavity surface within the cavity; and
  implanting one or more dopants into the semiconductor material through the first cavity surface to define an implanted region within the semiconductor material, and form an extended channel interface, the extended channel interface comprising, in part, an interface of the implanted region within the semiconductor material to the channel region of the semiconductor structure.

2. The method of claim 1, wherein implanting the one or more dopants into the semiconductor material through the first cavity surface positions, at least in part, the interface of the implanted region parallel to the second cavity surface of the cavity.

3. The method of claim 1, wherein implanting the one or more dopants comprises implanting the one or more dopants through the first cavity surface at an implant angle which extends the interface of the implanted region within the semiconductor material at an angle from the second cavity surface of the cavity.

4. The method of claim 1, wherein the extended channel interface further comprises, in part, the second cavity surface of the cavity.

5. The method of claim 4, wherein the interface of the implanted region to the channel region is non-planar with the second cavity surface of the cavity.

6. The method of claim 1, wherein the implanting comprises implanting the one or more dopants through the first cavity surface while minimizing lateral diffusion of the one or more dopants within the semiconductor material, thereby controlling location of the interface of the implanted region within the semiconductor material to the channel region.

7. The method of claim 6, wherein the implanting comprises implanting the one or more dopants into the semiconductor material through the first cavity surface at an implant angle which is normal to the first cavity surface, the implant angle facilitating forming the interface of the implanted region to the channel region coplanar with the second cavity surface.

8. The method of claim 6, wherein the implanting comprises implanting the one or more dopants into the semiconductor material through the first cavity surface with an implant energy which defines a depth of the interface of the implanted region to the channel region at a desired depth within the semiconductor material.

9. The method of claim 1, further comprising forming a source region or a drain region within, at least partially, the cavity subsequent to the implanting of the one or more dopants through the first cavity surface, wherein the forming comprises epitaxially growing the source region or the drain region at least partially within the cavity, wherein the implanting and the epitaxially growing together define the extended channel interface to the channel region of the semiconductor structure.

10. The method of claim 1, wherein the implanting the one or more dopants to define the implanted region within the semiconductor material facilitates increasing junction on-current while minimizing junction leakage current of the semiconductor structure.

11. The method of claim 1, wherein the cavity comprises a source cavity and the implanted region comprises an implanted source region, the extended channel interface comprises an extended source channel interface and the recessing further comprises recessing the semiconductor material to also form a drain cavity adjacent to the channel region, and wherein the implanting further comprises implanting through a first drain cavity surface the one or more dopants to form a drain implanted region, and wherein the method further comprises epitaxially growing a source region over the implanted source region and a drain region over the implanted drain region, the implanting and the epitaxially growing defining the extended source channel interface and an extended drain channel interface, at least in part, within the semiconductor material.

12. The method of claim 1, wherein the implanting further comprises performing an annealing process, subsequent to the implanting of the one or more dopants into the semiconductor material, the annealing process facilitating stabilizing the implanted region within the semiconductor material.

13. The method of claim 1, wherein the method further comprises fabricating a fin-type field effect transistor (FinFET), the FinFET being the semiconductor structure, and the fabricating including the recessing and the implanting.

* * * * *